(12) United States Patent
Lee et al.

(10) Patent No.: US 6,968,029 B1
(45) Date of Patent: Nov. 22, 2005

(54) FREQUENCY PRESCALER

(75) Inventors: Chang-Hyeon Lee, Irvine, CA (US); Akbar Ali, Garden Grove, CA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

(21) Appl. No.: 10/910,731

(22) Filed: Aug. 3, 2004

(51) Int. Cl.[7] ............................................. H03K 21/00
(52) U.S. Cl. ..................... 377/47; 377/48; 327/115; 327/117; 327/118; 327/160
(58) Field of Search ................... 377/47, 48; 327/115, 327/117, 118, 160

(56) References Cited

U.S. PATENT DOCUMENTS

| | | | |
|---|---|---|---|
| 4,264,863 A | 4/1981 | Kojima | |
| 5,361,044 A | 11/1994 | Norimatu et al. | |
| 5,640,116 A | 6/1997 | Kobayashi et al. | |
| 6,466,065 B1 * | 10/2002 | Takekawa | 327/115 |
| 6,614,870 B1 | 9/2003 | Miller | |

OTHER PUBLICATIONS

"RF Singal Processing, Fractional N Synthesizers", RFDesign, Nov. 2000, pp. 34-50(even pages only).

* cited by examiner

Primary Examiner—Margaret R. Wambach
(74) Attorney, Agent, or Firm—William J. Kolegraff

(57) ABSTRACT

A synchronous prescaler is provided that has an input line for receiving an input signal, which is synchronized to a low order dual modulus prescaler. The dual modulus prescaler generally divides responsive to a mode command line, but may have a dead-zone period where it may fail to respond to a generated mode command. The dual modulus prescaler also has an output line that is synchronized to an extender section. The extender section is used to further divide the input signal, and is synchronized to an adjustable counter section. A sync controller circuit receives an output from the counter section, as well as a timing signal from the extender, and generates the mode signal on the mode command line. In this arrangement, the sync controller generates the mode signal at a time when the low order dual modulus is in a condition to change divide modes, thereby avoiding providing the signal during the dead-zone period.

22 Claims, 5 Drawing Sheets

FREQUENCY PRESCALER

BACKGROUND

The field of the present invention is electronic circuits for frequency synthesis. More particularly, the present invention relates to a prescaler electronic circuit which uses a swallow counter.

Wireless communication systems transmit and receive modulated radio frequency (RF) signals, generally in accord with one or more telecommunications standard. These telecommunication standards, such as GSM, CDMA, CDMA2000, PDC, PHS, and others, generally set out specific and narrow bands of frequency operation. In order to maintain compliance with the frequency standards, wireless transceivers may use a crystal controlled oscillator to provide a highly accurate and stable frequency source, which controls and maintains the frequency output of a higher frequency local oscillator. Although the crystal controlled oscillator is a very good frequency source, it may take considerable time for the crystal oscillator to settle to a stable condition. In this regard, it is relatively time consuming to change the output frequency by adjusting the reference frequency. Since the wireless device may often need to change channels, and therefore frequency, it is undesirable to change the crystal oscillator and wait for the crystal oscillator to settle for each change. Further, the desired frequency change is often relatively small so alternatives to adjusting the crystal oscillator are often used.

In one method that avoids frequent changes to the crystal oscillator, a programmable divider circuit may be used to divide the local oscillator signal to a desired lower frequency. Using the selected divide ratio, the local oscillator signal is divided to a lower frequency, which is then locked to the reference signal from the crystal controlled oscillator. If there is a difference in frequency between the reference signal and the divided signal, then a feedback loop is used to appropriately adjust the frequency of the local oscillator. In this way, the local oscillator frequency is adjusted according to the divide ratio used in the programmable divider. In another use, the divide ratio of the programmable divider may be changed to generate different signal frequencies. In this way, different lower frequency signals may be readily available for use.

Programmable divider circuits may have frequency limitations, so if higher frequencies are used, a prescaler circuit may be used. A prescaler may divide at a fixed ratio, or for more flexibility, may allow for dividing at one of two available divide ratios. A prescaler with two available divide ratios or modes is often referred to as a dual modulus prescaler. The dual modulus prescaler has a mode control that allows a control circuit to set a first mode where the prescaler divides by a first divide ratio, or set a second mode where the prescaler divides by a second divide ratio. Since the prescaler usually operates at the frequency of the local oscillator signal, the prescaler circuit is typically kept compact and efficient. Accordingly, the dual modulus prescaler usually provides for only low order division. For example, a common dual modulus prescaler permits either dividing by 4 or dividing by 5. Since the local oscillator signal's frequency may be very high, for example, over 1 GHz, dividing by 4 or 5 does not sufficiently reduce the frequency for many wireless devices, and the frequency resolution may be too great to comply with the narrow channel separations in some of the telecommunications standards. For example, the local oscillator signal may need to be divided to operate near the frequency output of a crystal controlled oscillator.

To increase resolution and to offer more frequency reduction, the prescaler is often coupled to an extender circuit. The extender circuit is often a simple divide circuit that further divides the output from the prescaler. For example, a divide-by-8 extender may be connected to the 4/5 prescaler, with the resulting combined circuit acting as a dual 32/33 circuit. Although the dual 32/33 circuit provides adequate frequency reduction and frequency resolution for many wireless devices, it is difficult to satisfactorily implement. For example, a typical dual 32/33 circuit is often plagued by a dead zone. The dead zone is a window of time when the 4/5 prescaler may not properly respond to a mode command to change its divide ratio. If the mode command is generated during the dead zone, the low-order 4/5 prescaler will fail to properly transition to the second divide ratio. Missing the mode command results in an output signal that may jitter, have glitches, or cause a frequency drift, which is highly undesirable in sensitive radio devices. Although the dead zone is described with reference to the 32/33 combined circuit, other combinations may also have a similar dead zone problem.

The dead zone is a result of timing errors and delays inherent in the combination and supporting circuitry. These timing errors and delays are likely to be sensitive to temperature and process variations, so the impact of the dead zone will also vary between devices, and may change with temperature and age. Since the circuitry may be subject to such variation, it is particularly difficult to implement a design that can reliably avoid the dead zone. To minimize the undesirable effects of the dead zone, the combination circuitry may be designed with a relatively large margin of error for timing relationships, thereby increasing circuit cost and complexity. Also, signals may be processed to keep cleaner pulse shapes, which may result in fewer timing ambiguities. However, operating the 32/33 circuit with such pulses may use more power, generate more heat, and require higher quality circuitry and complex designs.

Therefore, there exists a need for a frequency prescaler that provides adequate frequency reduction, required frequency resolution, and that can be efficiently and robustly implemented.

SUMMARY

Briefly, a synchronous prescaler has an input line for receiving an input signal, which is synchronized to a low order dual modulus prescaler. The dual modulus prescaler generally divides responsive to a mode command line, but may have a dead-zone period where it may fail to respond to a generated mode command. The dual modulus prescaler also has an output line that is synchronized to an extender section. The extender section is used to further divide the input signal, and is synchronized to an adjustable counter section. A sync controller circuit receives an output from the counter section, as well as a timing signal from the extender, and generates the mode signal on the mode command line. In this arrangement, the sync controller generates the mode signal at a time when the low order dual modulus is in a condition to change divide modes, thereby avoiding providing the signal during the dead-zone period.

In one example, the synchronous prescaler is provided as part of a radio frequency device, and is useful to implement a desired frequency change. A control system determines a desired divide ratio, and sets the counters in the synchronous prescaler accordingly. The synchronous prescaler thereby divides the input frequency using the defined divide ratio. If the synchronous prescaler is operated in an open-loop arrangement, the synchronous prescaler is able to divide the input frequency into a desired lower-frequency signal. Alternatively, the synchronous prescaler may be operated in a closed-loop arrangement. In the closed loop arrangement, the output from the synchronous prescaler is compared to an accurate and stable reference frequency, and the frequency of the input signal is adjusted to keep the reference frequency and the output signal in phase and at the same frequency. In this way, the synchronous prescaler may be set to cause a desired frequency change in the input frequency, with the input signal being useful in other modules of the radio frequency device.

Advantageously, the synchronous prescaler provides that the mode signal is received at the dual modulus prescaler during an expected window of time. Since the mode signal arrives in an expected window, the mode signal avoids any "dead zone" in the dual modulus prescaler. By avoiding sending a mode signal in a dead zone (where the mode command would be ignored) the synchronous prescaler provides a robust structure to remove bits according to the mode command. In this way, the synchronous prescaler provides a more stable, clean, and predictable signal output.

BRIEF DESCRIPTION OF THE DRAWINGS

The invention can be better understood with reference to the following figures. The components within the figures are not necessarily to scale, emphasis instead being placed upon clearly illustrating the principles of the invention. Moreover, in the figures, like reference numerals designate corresponding parts throughout the different views. It will also be understood that certain components and details may not appear in the figures to assist in more clearly describing the invention.

DETAILED DESCRIPTION

Figure 1:
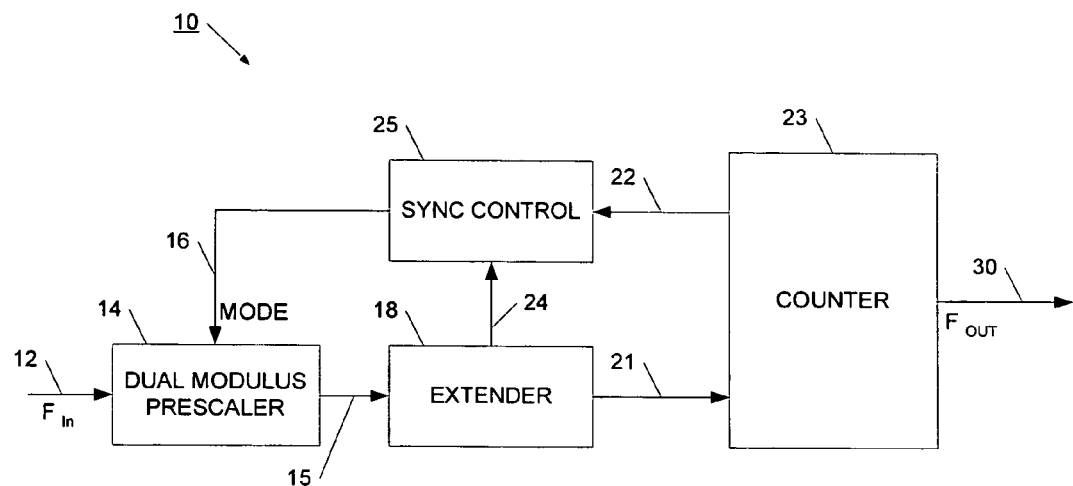
FIG. 1 is a block diagram of a synchronous prescaler in accordance with the present invention.

Referring now to FIG. 1, a synchronous prescaler is shown. Synchronous prescaler 10 receives an input signal 12 and processes the input signal into an output signal 30 having a desired frequency. Because the synchronous prescaler 10 provides for key synchronizations between circuit sections, the output signal 30 is particularly clean and stable, even with temperature and process variations. The synchronous prescaler 10 is illustrated as a block within a larger integrated circuit (IC) package. For example, the synchronous prescaler 10 may be included on a radio frequency (RF) transceiver IC. The RFIC generally has a local oscillator for generating a high frequency signal, which may be used as the input signal 12. The RFIC also typically has a highly accurate crystal controlled oscillator for providing a reference signal, which may be compared to the output signal 30. Using a feedback loop (not shown), the frequency of the local oscillator may be adjusted to bring the output signal 30 into phase with the reference signal. In this way, the prescaler 10 facilitates changing the frequency of the local oscillator while using a constant reference signal. When operating in such a feedback mode, the frequency of the input signal 12 is adjusted to maintain the output signal 30 at a desired reference rate. In other uses, the input signal 12 could remain constant, and the prescaler 10 generate output signals 30 at a selected frequency. Although the synchronous prescaler 10 is illustrated as an IC block, it will be appreciated that the synchronous prescaler 10 may take other physical forms. For example, the synchronous prescaler 10 may be a separate integrated circuit, formed as a gate array or in a programmable logic device, or fabricated using more discrete components.

A programmable counter module 23 is used to set a divide ratio between the input signal 12 and the output signal 30. In this way the desired output frequency is determined by the overall divide ratio "R" for the synchronous prescaler 10. In one example, the counter 23 has two adjustable count parameters, which for convenience, will be referred to as a "P" parameter and an "S" parameter. Generally, the divide ratio R is set according to the well known equation: R=P*N+S, where P is the predefined number of counts in a counter, N is the usual divide ratio for the prescaler, and S is the predefined number of times that the divide ratio N+1 is to used. In a specific example, the synchronous prescaler 10 may include divide ratios of 32 (N) and 33 (N+1). Generally, to obtain a more complete range of divide ratios, S is selected in the range from 0 to N−1 (31), while P is generally set to N (32) or larger. So to obtain a divide ratio of 1500 in this example, P is set to 46 and S is set to 28 (R=(46)*(32)+28). If the input frequency were at 1.5 GHz, then the output from the synchronous prescaler would be at 1 MHz. In a similar manner, to obtain a divide ratio of 1700, P is set to 53 and S is set to 4 (R=(53)*(32)+4). In this case, if the input frequency were still at 1.5 GHz, then the output from the synchronous prescaler would be at about 882,352 Hz. Operating in such an open loop mode enables output frequencies to be generated responsive to the selection of a specific divide ratio.

It may also be useful to operate the prescaler 10 in a closed loop to adjust the frequency of the input signal. For example, an accurate and stable reference signal (not shown) may be provided by a crystal controlled oscillator. The reference signal is compared to the output signal 30, and the input signal 12 adjusted to bring the reference signal and the output signal into phase. In such an arrangement, the frequency of the input signal is set according to the equation: $F_{in}=F_{Ref}*R$; where R is the divide ratio (P*N+S) as defined above. In an example where $F_{Ref}$ is provided at 1 MHz, then, setting R at 1500 will cause $F_{in}$ to be adjusted to 1.5 GHz, and setting R at 1700 will cause $F_{in}$ to be adjusted to 1.7 GHz. In this way, the input frequency from a high speed local oscillator may be adjusted by the proper selection and setting of the values of N, P and S in the prescaler 10. It will be understood that many combinations of P, N, and S may be selected to obtain particular divide ratios.

Synchronous prescaler 10 has a dual modulus prescaler 14. The dual modulus prescaler 14 is useful for dividing the input frequency 12 by one of two divide ratios. In one example, the dual modulus prescaler 14 is configured to divide the input frequency 12 by a divide ratio of 4, and upon a change in the mode input 16, to divide the input frequency 12 by a divide ratio of 5. In this way, the state of the mode input 16 determines if the input frequency is divided by a factor of 4 or by a factor of 5. Since the input frequency may be very high, for example, over 2 GHz, the dual modulus prescaler 14 is constructed to operate as a high speed divider.

An extender 18 uses the output from the dual modulus prescaler 14 to generate lower frequency signals. More particularly, the output from the dual modulus prescaler 14 is applied to the extender sync line 15, which is used to synchronize the extender 18 to the output of the dual modulus prescaler 14. In one example, the extender sync line 15 is used as the clock input for the extender 18. In this way, the extender 18 is clocked synchronously with the output of the dual modulus prescaler 14. The extender 18 may be implemented as a fixed ratio divider. For example, the extender 18 may have a fixed divide ratio of 8. When combined with the output of a 4/5 dual modulus prescaler, the dual modulus/extender combination would act as a 32/33 prescaler. The extender 18 may have multiple stages, and intermediate divide ratios may also be available for use. For example, an extender having a fixed ratio of 8 may also have output available for intermediate divide ratios of 2, 4, and 6. It will be understood that the extender 18 may be implemented in alternative ways consistent with the synchronous prescaler 10.

A counter 23 is synchronized to the output of the extender 18. The extender provides a counter sync line 21, which couples to the counter 23. In one example, the counter sync line 21 couples to the clock input for the counter 23. In this way, the counter 23 is clocked synchronously with the output of the extender 18. The counter 23 may be implemented as two connected counters. The first counter, the "P-counter" may be used to count the total number of pulses received from the extender 18. When a pre-defined number of pulses P have been received, the P-counter resets, and transitions the output signal 30. The second counter, the "swallow or S-counter", may be used to count the number of times to trigger the dual modulus prescaler 14 to divide by the larger ratio. In this way, the S-counter is used to count the number of pulses that are to be "swallowed" or removed from the input frequency. By adjusting the values for P and S, the overall divide ratio for the synchronous prescaler 10 may be adjusted.

The counter 23 has a counter output line 22 which is received into a sync control 25. In one example, a signal is generated on output line 22 each time the prescaler 14 is to divide by N+1. In this way, the counter output line 22 causes the dual modulus prescaler 14 to change from dividing by N to dividing by N+1. The sync control 25 also is coupled to a sync window line 24 from the extender 24. The extender 18 generates one or more signals on the sync window line 24, with these signal(s) defining a window of time where the dual modulus prescaler 14 is in a condition to receive a mode signal on the mode control line 16. By coordinating the timing of the mode control signal, the sync control 25 is used to provide a general synchronization between the dual modulus prescaler 14, the extender 18, and the counter 23. It will be understood that the term "synchronization" means that the signals between electronic modules are coordinated to be in step or phase, so that signals are received in an expected period. The degree of synchronization may be adjusted according to frequency, margin of error, operational temperature ranges, or other application specific requirements.

Using the synchronous prescaler 10, the mode signal is always received at the dual modulus prescaler 14 during an expected window of time. Since the mode signal always arrives in an expected window, the mode signal avoids any "dead zone" in the dual modulus prescaler 14. By avoiding sending a mode signal in a dead zone (where the mode command would be ignored) the synchronous prescaler 10 provides a robust structure to remove bits according to the mode command. In this way, the synchronous prescaler 10 provides a more stable, clean, and predictable signal output.

Figure 2:
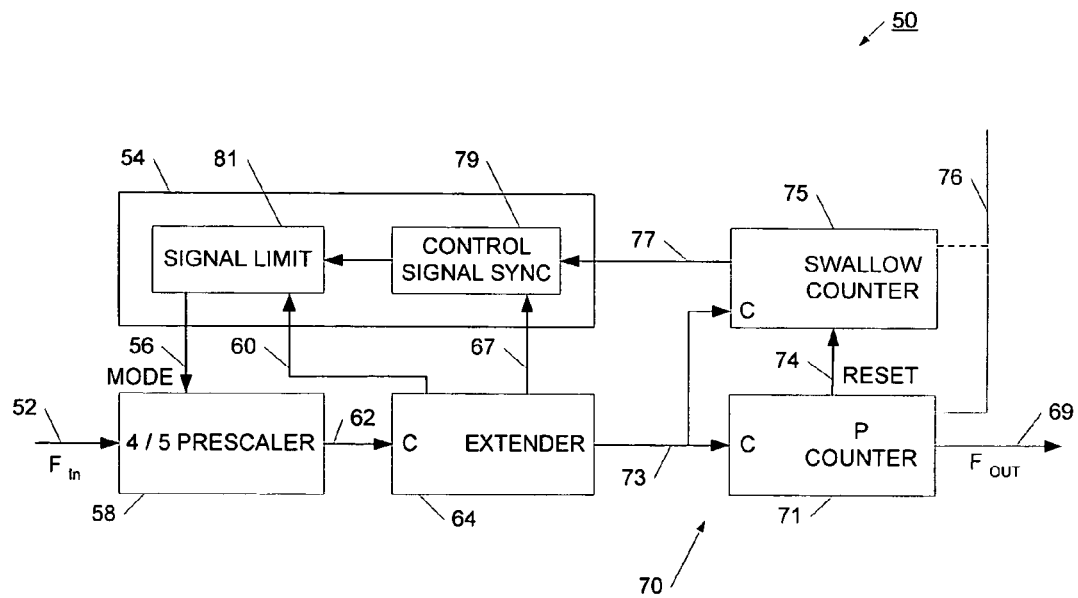
FIG. 2 is a block diagram of a synchronous prescaler in accordance with the present invention.

Referring now to FIG. 2, a synchronous prescaler is shown. Synchronous prescaler 50 receives an input signal 52 and processes the input signal into an output signal 69 having a desired frequency. Because the synchronous prescaler 50 provides for key synchronizations between circuit sections, the output signal 69 is particularly clean and stable, even with temperature and process variations. The synchronous prescaler 50 is illustrated as a block within a larger integrated circuit (IC) package. Although the synchronous prescaler 50 is illustrated as an IC block, it will be appreciated that the synchronous prescaler 50 may take other physical forms. For example, the synchronous prescaler 50 may be a separate integrated circuit, formed as a gate array or in a programmable logic device, or fabricated using more discrete components. It will also be understood that the prescaler 50 may be operated in an open loop arrangement to generate selected output frequencies from a constant input frequency, or may be operated in a closed-loop arrangement to selectively adjust the frequency of the input frequency while holding the output frequency constant.

Synchronous prescaler 50 has a 4/5 modulus prescaler 58. The 4/5 modulus prescaler 58 is useful for dividing the input frequency 52 by either 4 or by 5. The 4/5 modulus prescaler 58 selects which divide ratio to use responsive to a mode control signal received on mode control line 56. For example, the 4/5 modulus prescaler 58 may divide by 4 while the mode control signal is in one state, and when the mode's state changes, the 4/5 modulus prescaler 58 may divide by 5. It will be appreciated that other divide ratios may be used for specific applications and frequency requirements. Since the input frequency may be very high, for example, over 2 GHz, the dual modulus prescaler 58 is constructed to operate as a high speed divider.

An extender 64 uses the output 62 from the 4/5 modulus prescaler 58 to generate lower frequency signals. More particularly, the output 62 from the 4/5 modulus prescaler 58 is coupled to the clock input for the extender 64. In this way, the extender 64 is clocked synchronously with the output of the 4/5 modulus prescaler 58. The extender 64 may be implemented as a fixed ratio divider. For example, the extender 64 may have a fixed divide ratio of 8. When combined with the output of the 4/5 dual modulus prescaler 58, the dual modulus/extender combination acts as a 32/33 prescaler. The extender 64 may have multiple stages, and intermediate divide ratios may also be available for use. For example, the extender 64 may also have output available for divide ratios of 2, 4, and 6. It will be understood that the extender 64 may be implemented in alternative ways consistent with the synchronous prescaler 50.

A counter section 70 is synchronized to the output of the extender 64. The counter section 70 has two connected counters 71 and 75. The extender 64 provides a counter sync line 73, which couples to the clock input for counter 71 and also to the clock input for counter 75. Thus the clock section 70 is synchronized with the extender 64. The first counter, the "P-counter" 71 may be used to count the total number of pulses received from the extender 64. When a pre-defined number of pulses P have been received, the P-counter resets, and transitions the output signal 69. The second counter, the "swallow or S-counter 75", may be used to count the number of times to trigger the 4/5 modulus prescaler 58 to divide by 5. In this way, the S-counter is used to count the number of pulses that are to be "swallowed" or removed from the input frequency. The swallow counter also resets after P counts by the P-counter 71. After P counts, the P-counter may send a reset signal on line 74 to the S-counter 75. Alternatively, the line 74 may have the same output as output line 69, so that the S-Counter can reset itself after P counts.

Take for example where the synchronous prescaler 50 is constructed as a 32/33 prescaler, which defines "N" as 32 and "N+1" as 33. With N so defined, P will typically be set to 32 (N) or larger, while S is set in the range of 0 to 31 (N−1). For this example, assume that a divide ratio R of 1130 is desired. To select an R of 1130, P is selected and set to be 35 and S is predefined to be 10. The input frequency 52 is provided as a continuous stream of pulses, with each pulse representing a bit. At the start of each cycle both the P and the S counters are reset, and the output signal 69 is in a first state, for example, a low state. For the first 10 pulses of the input signal, both the S and the P counters will advance. For each of these first pulses, since the S "count" is less than 10, then swallow counter 75 causes the 4/5 prescaler to divide by 5, thereby "swallowing" a bit from each cycle. Since the extender 64 divides by 8, the first 10 pulses generated by the extender are 33 bits in duration. When S reaches 10, the S-counter causes the 4/5 prescaler to divide by 4. Now, the remaining 25 pulses from the extender 64 are each 32 bits in duration. When the P-counter reaches 35, then the output signal transitions to the other state, for example the high state. The counters are reset and another cycle is started. A control circuit (not shown) may set or adjust the values of P and S using control line 76. In one example, the control line 76 receives the value of P and S from a TX/RX control circuit. In this way, the TX/RX control circuit can adjust the frequency output from the synchronous prescaler 50 according to changing channel frequency requirements.

A sync control 54 is provided to provide general synchronization within the synchronous prescaler 50. The sync control 54 may have a signal sync 79 portion and a signal limit 81 portion. The swallow counter generates a signal on the counter output line 77 when the P count is less than the S count. The counter output line is coupled to the signal sync 79. The signal sync 79 also is coupled to the extender through control line 67. In one example, the signal on the control line 67 is the same as the signal on extender output 73. Since the extender output 73 is used as the clock for the clock section 70, the control line 67 acts to synchronize the counter section 70 more closely with the dividing circuitry. The output from the signal sync 79 is received in the signal limit 81, which is coupled to the extender 64 through control line 60. The extender 64 generates one or more signals on the control line 60, with these signal(s) defining a window of time where the 4/5 modulus prescaler 58 is in a condition to receive a mode signal on the mode control line 56. By coordinating the timing of the mode control signal, the signal limit 81 is used to provide a general synchronization between the dual modulus prescaler 14, the extender 18, and the counter 23. The degree of synchronization may be adjusted according to frequency, margin of error, operational temperature ranges, or other application specific requirements.

Using the synchronous prescaler 50, the mode signal is always received at the 4/5 modulus prescaler 58 during an expected window of time. Since the mode signal always arrives in an expected window, the mode signal avoids any "dead zone" in the 4/5 modulus prescaler 58. By avoiding sending a mode signal in a dead zone (where the mode command would be ignored) the synchronous prescaler 50 provides a robust structure to remove bits according to the mode command. In this way, the synchronous prescaler 50 provides a more stable, clean, and predictable signal output.

Figure 3:
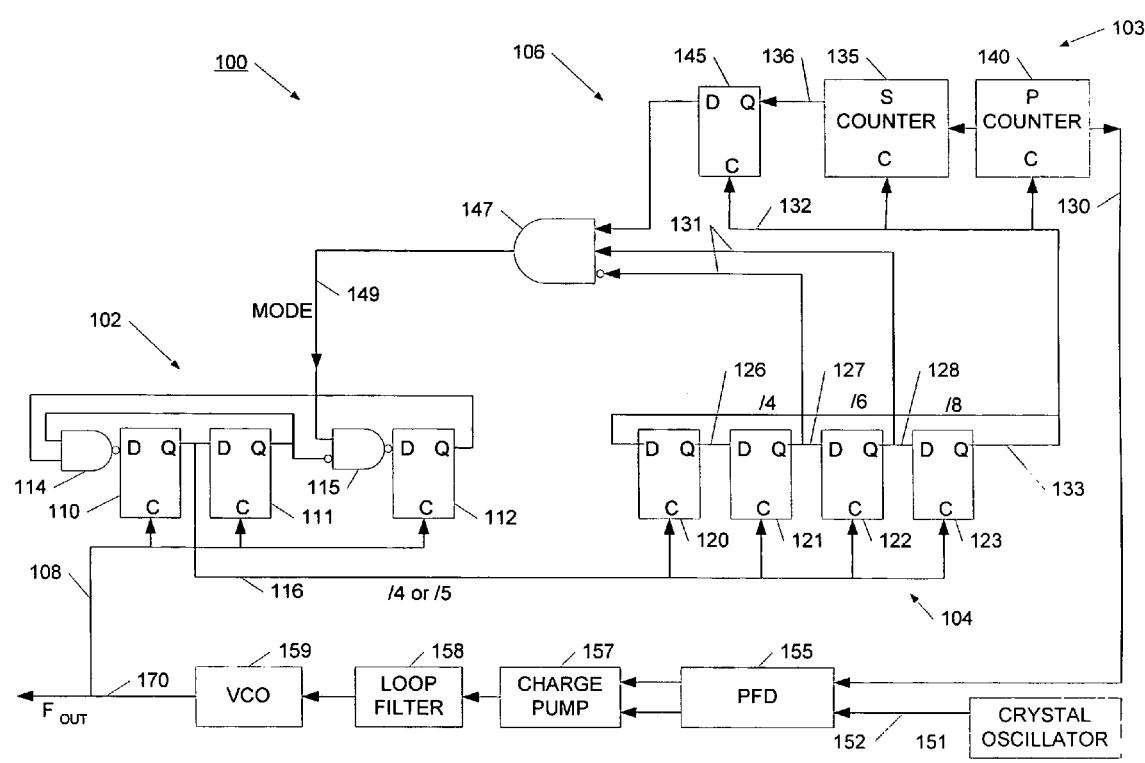
FIG. 3 is a block diagram of a closed-loop synchronous prescaler in accordance with the present invention.

Referring now to FIG. 3, a specific implementation of the synchronous prescaler will be described. Synchronous prescaler 100 operates in a closed loop feed back arrangement to adjust the frequency generated by a local oscillator 159. The output signal 170 from the local oscillator 159 may be used in other circuitry according to application needs. The output from the local oscillator is also used as the input signal 108 to the prescaler 100. Because the synchronous prescaler 100 provides for key synchronizations between circuit sections, the output signal 130 is particularly clean and stable, even with temperature and process variations. The synchronous prescaler 100 is illustrated as a block within a larger integrated circuit (IC) package. For example, the synchronous prescaler 100 may be included on a radio frequency (RF) transceiver IC. Although the synchronous prescaler 100 is illustrated as an IC block, it will be appreciated that the synchronous prescaler 100 may take other physical forms. For example, the synchronous prescaler 100 may be a separate integrated circuit, formed as a gate array or in a programmable logic device, or fabricated using more discrete components.

Synchronous prescaler 100 has a 4/5 modulus prescaler 102. The 4/5 modulus prescaler 102 is useful for dividing the reference frequency 108 by either 4 or by 5. The 4/5 modulus prescaler 102 selects which divide ratio to use responsive to a mode control signal received on mode control line 149. For example, the 4/5 modulus prescaler 102 may divide by 4 while the mode control signal is in one state, and when the mode's state changes, the 4/5 modulus prescaler 102 may divide by 5. It will be appreciated that other divide ratios may be used for specific applications and frequency requirements. Since the input frequency 108 may be very high, for example, over 2 GHz, the dual modulus prescaler 102 is constructed to operate as a high speed divider.

The 4/5 modulus prescaler is constructed using flip-flops 110, 111, and 112, as well as NAND gates 114 and 115. The construction and operation of a 4/5 prescaler circuit is well known, so will not be discussed in detail. The input signal 108 is used as the clock input for each of the flip-flops 110, 111, and 112. In this way, the 4/5 prescaler is fully synchronous as each flip-flop responds to the same clock trigger.

An extender 104 uses the output 116 from the 4/5 modulus prescaler 102 to generate lower frequency signals. More particularly, the output 116 from the 4/5 modulus prescaler 102 is coupled to the clock input for the extender 104. In this way, the extender 104 is clocked synchronously with the output of the 4/5 modulus prescaler 102. The extender 104 is a fixed ratio divider having a fixed divide ratio of 8. When combined with the output of the 4/5 dual modulus prescaler 102, the dual modulus/extender combination acts as a 32/33 prescaler. The extender 104 has multiple stages, and intermediate divide ratios are available for use. The extender 104 has output available for intermediate divide ratios of 2, 4, and 6.

The extender 104 is a divide by 8 circuit constructed using four flip-flops 120, 121, 122, and 123. The output 116 from the 4/5 prescaler is connected to the clock input for each flip-flop 120, 121, 122, and 123. In this way, the extender 104 is a synchronous divider. The construction and operation of a synchronous divider circuit is well known, so will not be discussed in detail. The timing and phase of the extender 104 is coordinated with the 4/5 prescaler 102, but is not fully synchronous as the extender 104 and the prescaler 102 use different clocks. In this way, the extender 104 maintains sufficient timing and phasing coordination with the prescaler 102, but does not require the power and circuitry to operate at the full clock speed of the reference signal. It will be understood that the extender 104 may be implemented in alternative ways consistent with the synchronous prescaler 100.

A counter section 103 is synchronized to the output of the extender 104. The counter section 103 has two connected counters 135 and 140. The extender 104 provides a counter sync line 133, which couples to the clock input for counter 135 and also to the clock input for counter 140. Thus the counter section 103 is synchronized with the extender 104. The first counter, the "P-counter" 140 may be used to count the total number of pulses received from the extender 104. When a pre-defined number of pulses P have been received, the P-counter resets, and transitions the output signal 130. The second counter, the "swallow or S-counter 135", may be used to count the number of times to trigger the 4/5 modulus prescaler 102 to divide by 5. In this way, the S-counter is used to count the number of pulses that are to be "swallowed" or removed from the input frequency. The swallow counter also resets after P counts. After P counts, the P-counter 140 may send a reset signal to the S-counter 135. Alternatively, the S-Counter can reset itself after P counts.

A sync control 106 is provided to provide general synchronization within the synchronous prescaler 100. The sync control 106 may have a signal sync 145 portion and a signal limit 145 portion. The swallow counter generates a signal on the counter output line 136 when the P count is less than the S count. The counter output line is coupled to the signal sync 145, which may be implemented as a flip-flop. The signal sync 145 also is coupled to the extender 104 through control line 132, which is the same as the signal on extender output 133. Since the extender output 133 is used as the clock for the clock section 103, the control line 132 acts to synchronize the counter section 103 more closely with the dividing circuitry.

The output from the signal sync 145 is received in the signal limit 147, which may be implemented as an AND gate. The extender 104 generates one or more signals on the control lines 131, with these signal(s) defining a window of time where the 4/5 modulus prescaler 102 is in a condition to receive a mode signal on the mode control line 149. More specifically, the output from the intermediate stage 121 provides a divide-by-4 signal, and the output from the intermediate stage 122 provides a divide-by-6 signal. The signal limit 147 only generates a signal on the mode control line 149 when the output from the signal limit is high, the output from the divide-by-6 counter is high, and the output from the divide-by-4 counter is low. By coordinating the timing of the mode control signal, the signal limit 147 is used to provide a general synchronization between the dual modulus prescaler 102, the extender 104, and the counter 103. It will be understood that other control lines may be used as inputs to the signal limit 147. Also, the degree of synchronization may be adjusted according to frequency, margin of error, operational temperature ranges, or other application specific requirements.

Using the synchronous prescaler 100, the mode signal is always received at the 4/5 modulus prescaler 102 during an expected window of time. Since the mode signal always arrives in an expected window, the mode signal avoids any "dead zone" in the 4/5 modulus prescaler 102. By avoiding sending a mode signal in a dead zone (where the mode command would be ignored) the synchronous prescaler 100 provides a robust structure to remove bits according to the mode command. In this way, the synchronous prescaler 100 provides a more stable, clean, and predictable signal output 130.

The output signal 130 is received into a phase detector 155, which also receives a highly accurate and stable reference signal 152 from a crystal controlled oscillator 151. A charge pump 157 and loop filter 158 amplify and filter the output from the phase detector 157. The resulting signal is received into the voltage controlled oscillator 159, which causes a frequency adjustment for the signal 170. In this way, the frequency of the local oscillator 159 is adjusted to maintain the output signal 130 in phase and at the same frequency as the reference signal 151. By selecting and setting divide ratios for the prescaler 100, the frequency of the local oscillator 159 may be changed to a desired frequency output 170.

Figure 4:
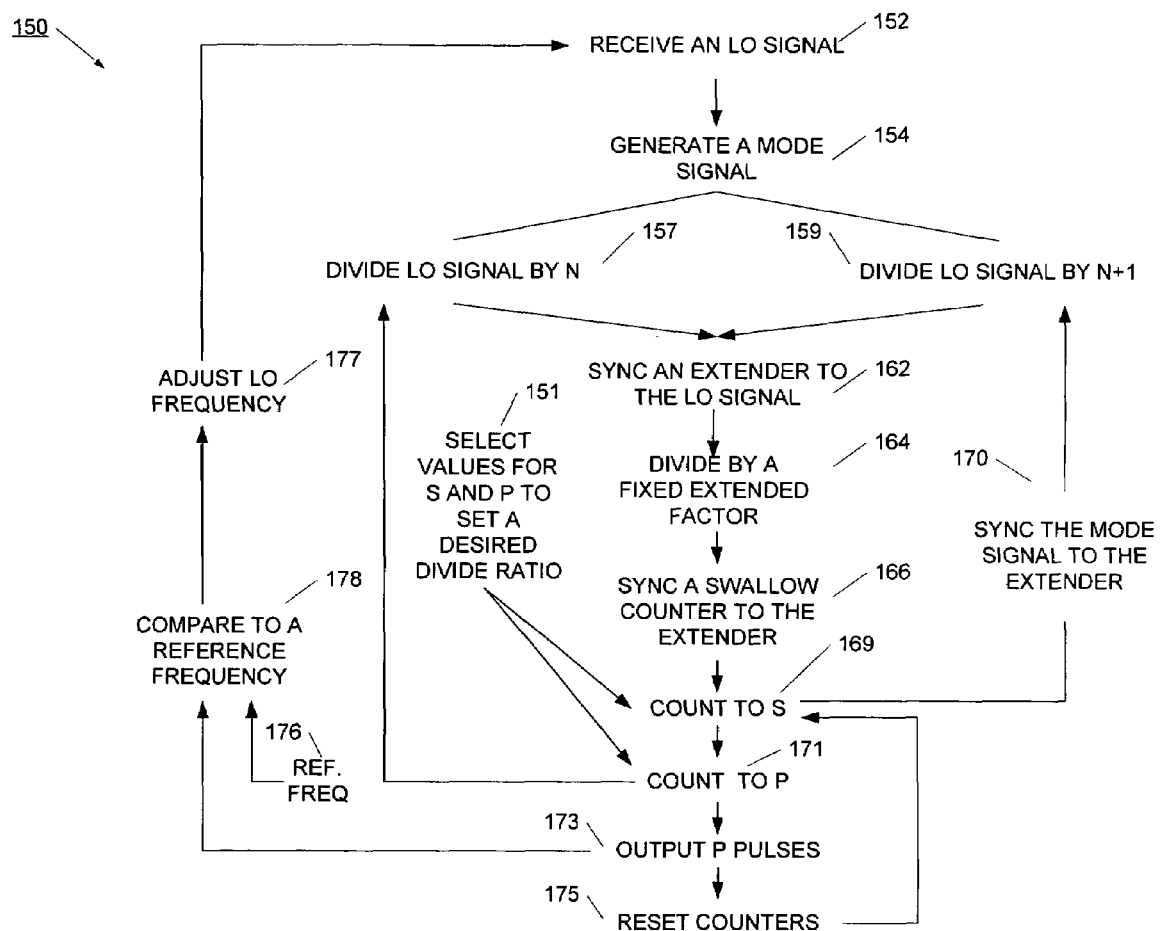
FIG. 4 is a flow chart of a close-loop process for generating a signal in accordance with the present invention.

Referring now to FIG. 4, a method for generating a signal is shown. Method 150 may operate on a device similar to the synchronous prescaler 100 described with reference to FIG. 3. Method 150 receives a local oscillator signal as shown in block 152. The local oscillator signal is divided to an output signal according to a selected divide ratio, which is set by setting values for S and P as shown in block 151. The divide ratio is determined according to the equation R= PN+S, where P is the predefined number of counts in a counter, N is the usual divide ratio for the prescaler, and S is the predefined number of times that the divide ratio N+1 is to used. A mode signal is generated as shown in block 154, with the mode signal received by a prescaler. Responsive to the state of the mode signal, the prescaler will divide the local oscillator signal by N (157) or by N+1 (159). The output of the prescaler is used as the clock for each stage of an extender circuit, so the extender is coordinated or synchronized with the prescaler, as shown in block 162. The extender further divides the signal, as shown in block 164. The output from the extender is provided to a pair of counters. An S-counter is used to count to S, while the P counter is used to count to P. While S<P, the S-counter outputs a signal that causes the prescaler to divide by N+1. The signal from the S-counter is synchronized with the extender to generate the mode signal, as shown in block 170. In this way, the mode signal is generally synchronized with the dividing circuitry so that the mode signal is only generated when the prescaler is in a condition to respond to it. By coordinating the timing of the generation of the mode signal, the mode signal is never received at the prescaler in a dead zone.

When S=P, the S-counter causes the prescaler to divide by N. The method continues to divide by N until P pulses have been counted by the P counter, as shown in block 171. When P pulses have been output as shown in block 173, the counters are both reset 175. The output signal from block 173 is compared to a reference signal 176 in block 178. The local oscillator signal is adjusted responsive to the comparison, as shown in block 177. Using this closed-loop feedback process, the frequency output for the local oscillator is set according to the value set for the divide ratio.

Figure 5:
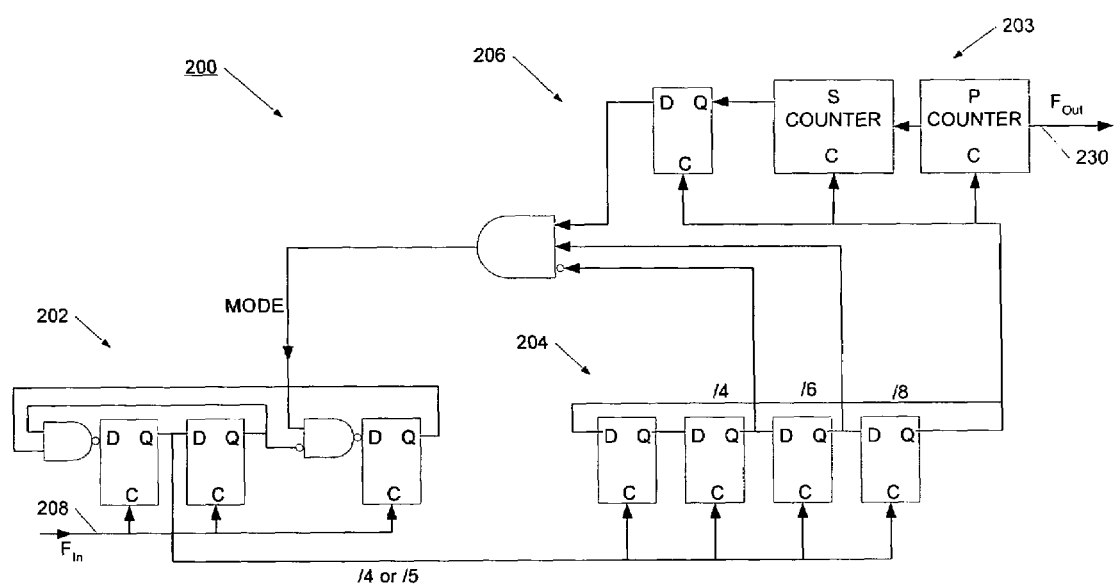
FIG. 5 is a block diagram of an open-loop synchronous prescaler in accordance with the present invention.

Referring now to FIG. 5, a specific implementation of the synchronous prescaler will be described. Synchronous prescaler 200 is similar to synchronous prescaler 100 described with reference to FIG. 3, except prescaler 200 operates in an open loop arrangement. Prescaler 200 receives a reference signal 208 and processes the reference signal into an output signal 230 having a desired frequency. Because the synchronous prescaler 200 provides for key synchronizations between circuit sections, the output signal 230 is particularly clean and stable, even with temperature and process variations. The synchronous prescaler 200 is illustrated as a block within a larger integrated circuit (IC) package. For example, the synchronous prescaler 100 may be included on a radio frequency (RF) transceiver IC. Although the synchronous prescaler 200 is illustrated as an IC block, it will be appreciated that the synchronous prescaler 200 may take other physical forms. For example, the synchronous prescaler 200 may be a separate integrated circuit, formed as a gate array or in a programmable logic device, or fabricated using more discrete components.

Synchronous prescaler 200 has a 4/5 modulus prescaler 202. The 4/5 modulus prescaler 202 is useful for dividing the reference frequency 208 by either 4 or by 5. The 4/5 modulus prescaler 202 selects which divide ratio to use responsive to a mode control signal received on mode control line. For example, the 4/5 modulus prescaler 202 may divide by 4 while the mode control signal is in one state, and when the mode's state changes, the 4/5 modulus prescaler 202 may divide by 5. It will be appreciated that other divide ratios may be used for specific applications and frequency requirements. Since the reference frequency may be very high, for example, over 2 GHz, the dual modulus prescaler 202 is constructed to operate as a high speed divider.

An extender 204 uses the output from the 4/5 modulus prescaler 202 to generate lower frequency signals. More particularly, the output from the 4/5 modulus prescaler 202 is coupled to the clock input for the extender 204. In this way, the extender 204 is clocked synchronously with the output of the 4/5 modulus prescaler 202. The extender 204 is a fixed ratio divider having a fixed divide ratio of 8. When combined with the output of the 4/5 dual modulus prescaler 202, the dual modulus/extender combination acts as a 32/33 prescaler. The extender 204 has multiple stages, and intermediate divide ratios are available for use. The extender 204 has output available for intermediate divide ratios of 2, 4, and 6.

A counter section 203 is synchronized to the output of the extender 204. The counter section 203 has two connected counters, an S counter and a P counter. The extender 204 provides a counter sync line, which couples to the clock input for the counters. Thus the counter section 203 is synchronized with the extender 204. The first counter, the "P-counter" may be used to count the total number of pulses received from the extender 204. When a pre-defined number of pulses P have been received, the P-counter resets, and transitions the output signal 230. The second counter, the "swallow or S-counter", may be used to count the number of times to trigger the 4/5 modulus prescaler 202 to divide by 5. In this way, the S-counter is used to count the number of pulses that are to be "swallowed" or removed from the input frequency. The swallow counter also resets after P counts. After P counts, the P-counter may send a reset signal to the S-counter. Alternatively, the S-Counter can reset itself after P counts.

A sync control 206 is provided to provide general synchronization within the synchronous prescaler 200. The sync control 206 may have a signal sync portion and a signal limit portion. The swallow counter generates a signal on the counter output line when the P count is less than the S count. The counter output line is coupled to the signal sync, which may be implemented as a flip-flop. The signal sync also is coupled to the extender through control line, which is the same as the signal on extender output. Since the extender output is used as the clock for the counter section 203, the control line acts to synchronize the counter section 203 more closely with the dividing circuitry.

The output from the signal sync is received in the signal limit circuit, which may be implemented as an AND gate. The extender 204 generates one or more intermediate timing signals, with these signal(s) defining a window of time where the 4/5 modulus prescaler 202 is in a condition to receive a mode signal. By coordinating the timing of the mode control signal, the signal limit is used to provide a general synchronization between the dual modulus prescaler 202, the extender 204, and the counter 203. It will be understood that other control lines may be used as inputs to the signal limit circuit. Also, the degree of synchronization may be adjusted according to frequency, margin of error, operational temperature ranges, or other application specific requirements.

Using the synchronous prescaler 200, the mode signal is always received at the 4/5 modulus prescaler 202 during an expected window of time. Since the mode signal always arrives in an expected window, the mode signal avoids any "dead zone" in the 4/5 modulus prescaler 202. By avoiding sending a mode signal in a dead zone (where the mode command would be ignored) the synchronous prescaler 200 provides a robust structure to remove bits according to the mode command. In this way, the synchronous prescaler 200 provides a more stable, clean, and predictable signal output.

Figure 6:
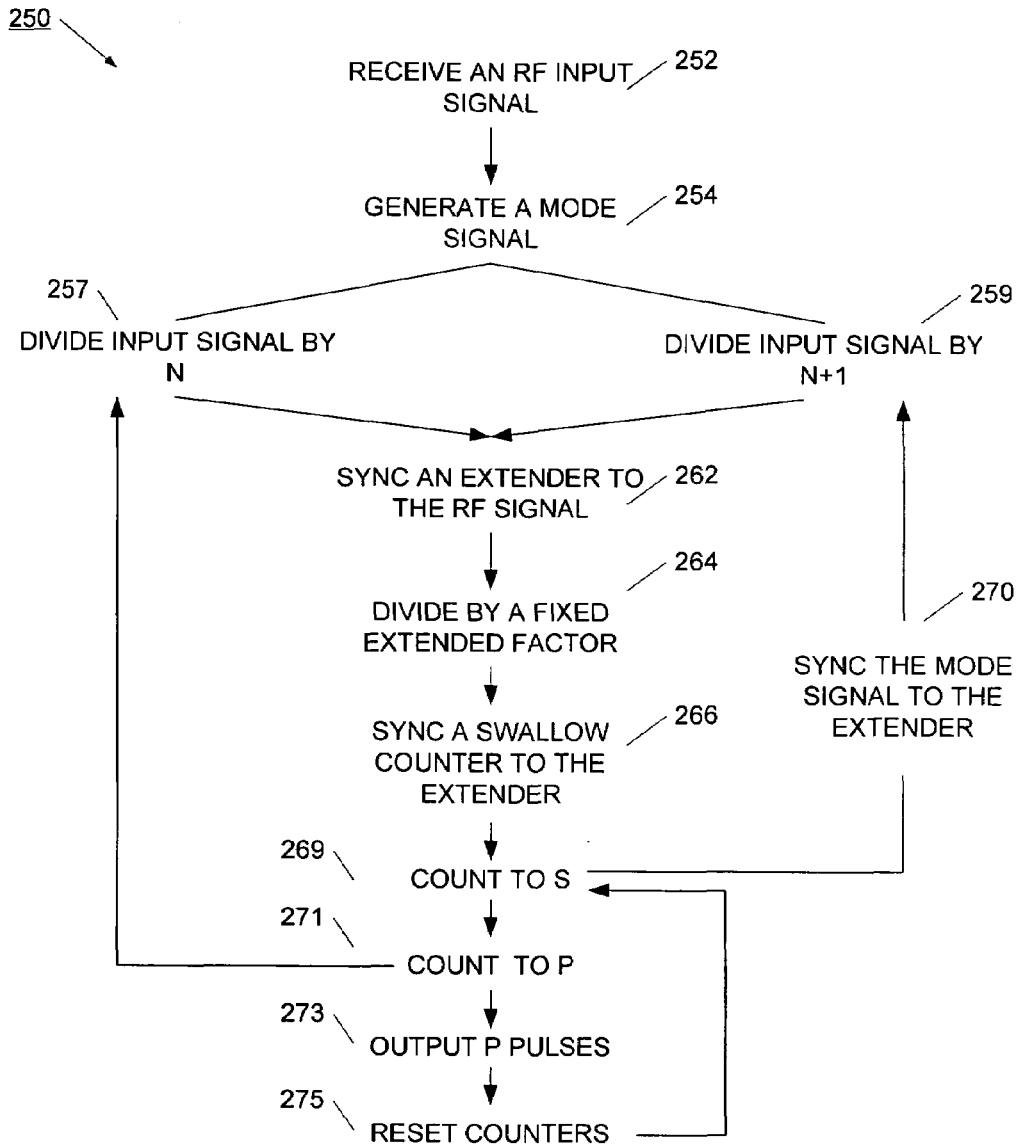
FIG. 6 is a flow chart of an open-loop process for generating a signal in accordance with the present invention.

Referring now to FIG. 6, a method for generating a signal is shown. Method 250 may operate on a device similar to the synchronous prescaler 200 described with reference to FIG. 5. Method 250 receives an input signal as shown in block 252. The input signal is divided to an output signal according to a selected divide ratio. The divide ratio is determined according to the equation R=PN+S, where P is the pre-defined number of counts in a counter, N is the usual divide ratio for the prescaler, and S is the predefined number of times that the divide ratio N+1 is to used. A mode signal is generated as shown in block 254, with the mode signal received by a prescaler. Responsive to the state of the mode signal, the prescaler will divide the reference signal by N (257) or by N+1 (259). The output of the prescaler is used as the clock for each stage of an extender circuit, so the extender is coordinated or synchronized with the prescaler, as shown in block 262. The extender further divides the signal, as shown in block 264. The output from the extender is provided to a pair of counters. An S-counter is used to count to S, while the P counter is used to count to P. While S<P, the S-counter outputs a signal that causes the prescaler to divide by N+1. The signal from the S-counter is synchronized with the extender to generate the mode signal, as shown in block 270. In this way, the mode signal is generally synchronized with the dividing circuitry so that the mode signal is only generated when the prescaler is in a condition to respond to it. By coordinating the timing of the generation of the mode signal, the mode signal is never received at the prescaler in a dead zone.

When S=P, the S-counter causes the prescaler to divide by N. The method continues to divide by N until P pulses have been counted by the P counter, as shown in block 271. When P pulses have been output as shown in block 273, the counters are both reset 275. In this way, an output signal is generated by dividing an input signal by a selected divide ratio.

While particular preferred and alternative embodiments of the present intention have been disclosed, it will be appreciated that many various modifications and extensions of the above described technology may be implemented using the teaching of this invention. All such modifications and extensions are intended to be included within the true spirit and scope of the appended claims.

What is claimed is:

1. A synchronous prescaler, comprising:
a dual modulus circuit having a sync output line and a mode control line, the dual modulus circuit having an input signal line operating as a clock signal;
a multi-stage extender arranged to receive the sync output line into at least two stages of the multi-stage extender;
a counter coupled to the extender by a counter sync line and having a counter output line, the counter arranged to generate an output signal on an output line;
a sync controller coupled to the counter output line and to at least one of the stages of the extender; and
wherein the sync controller is coupled to the mode control line.

2. The synchronous prescaler according to claim 1, where the sync controller further comprises:
a signal sync circuit coupled to the counter; and
a signal limit circuit coupled to the extender and the signal sync circuit.

3. The synchronous prescaler according to claim 2, where the signal sync circuit includes a flip-flop, and the clock of the flip-flop is coupled to the counter sync line.

4. The synchronous prescaler according to claim 2, where the signal limit circuit includes a logic gate with inputs coupled to the extender.

5. The synchronous prescaler according to claim 4, where the inputs to the logic gate couple to more than one stage of the extender.

6. The synchronous prescaler according to claim 5, where the logic gate is an AND gate, and the output of the AND gate is coupled to the mode control line.

7. The synchronous prescaler according to claim 1, where the counter further includes:
an N-counter; and
a swallow counter.

8. The synchronous prescaler according to claim 7, where the counter sync line is coupled to a clock input for the N-counter, and the counter sync line is also coupled to a clock input for the swallow counter.

9. The synchronous prescaler according to claim 1, wherein the dual modulus circuit is a 4/5 prescaler.

10. The synchronous prescaler according to claim 9, where the extender is a 32/33 extender.

11. The synchronous prescaler according to claim 1, where the sync controller is coupled to a plurality of the stages of the extender.

12. The synchronous prescaler according to claim 1, where the multi-stage extender is arranged to receive the sync output line into every stage of the multi-stage extender.

13. The synchronous prescaler according to claim 1, where each stage of the multi-stage extender includes a respective flip-flop.

14. The synchronous prescaler according to claim 13, wherein the sync output line is received at the clock input of each respective flip-flop.

15. The synchronous prescaler according to claim 1, further including:
a phase detector arranged to receive the output signal and a reference signal;
a voltage controlled oscillator coupled to the phase detector, the voltage controlled oscillator configured to generate an output signal responsive to the output of the phase detector; and
wherein the output from the voltage controlled oscillator is coupled to the input signal line for the dual modulus circuit.

16. A synchronous prescaler, comprising:
a low order dual modulus prescaler (DMP);
an extender section;
a counter configured to set a selected divide ratio;
a sync control; and wherein
the synchronous prescaler operates the steps of:
receiving an input signal;
using the received signal as a clock for the DMP, and dividing the received signal according to a mode signal;
clocking the extender section with the divided signal to generate a counter sync signal and a timing signal;
clocking the counter with the counter sync signal, the counter generating an output signal and a swallow signal, the output signal and the swallow signal being generated according to the divide ratio; and
synchronizing the swallow signal with the timing signal to generate the mode signal.

17. The synchronous prescaler according to claim 16, further comprising:
a phase detector arranged to receive the output signal and a reference signal;
a voltage controlled oscillator coupled to the phase detector, the voltage controlled oscillator configured to generate an output signal responsive to the output of the phase detector; and
wherein the output from the voltage controlled oscillator is the input signal to the DMP.

18. The synchronous prescaler according to claim 16, wherein the synchronous prescaler further operates the steps of:
receiving a control signal from a TX/RX controller in a wireless device, the control signal having information indicative of a desired frequency; and
setting the counter according to the control signal, the counter set to implement the divide ratio to generate the output signal at the desired frequency.

19. The synchronous prescaler according to claim 18, wherein the TX/RX controller implements a GSM or EDGE frequency standard, and the desired frequency is in the GSM or EDGE frequency band.

20. The synchronous prescaler according to claim 18, wherein the TX/RX controller implements a CDMA, WCDMA, or CDMA2000 frequency standard, and the desired frequency is in the CDMA, WCDMA, or CDMA2000frequency band.

21. A synchronous prescaler, comprising:
a dual modulus prescaler (DMP) dividing an input signal by a divide value that is set responsive to the state of a mode signal;
an extender receiving the divided signal as its clock inputs, the extender dividing the received signal by a predefined ratio;
a counter receiving the output from the extender as its clock inputs, the counter generating a swallow signal and an output signal;
a sync controller receiving the swallow signal and a timing window signal from the extender, the sync controller setting the state of the mode signal; and
wherein the values set in the counter are set according to a desired divide ratio.

22. The synchronous prescaler according to claim 21, further comprising:
a phase detector arranged to receive the output signal and a reference signal;
a voltage controlled oscillator coupled to the phase detector, the voltage controlled oscillator configured to generate an output signal responsive to the output of the phase detector; and
wherein the output from the voltage controlled oscillator is the input signal to the DMP.

* * * * *